(12) United States Patent
Bernards et al.

(10) Patent No.: US 7,591,956 B2
(45) Date of Patent: Sep. 22, 2009

(54) METHOD AND COMPOSITION FOR SELECTIVELY STRIPPING NICKEL FROM A SUBSTRATE

(75) Inventors: Roger F. Bernards, South Haven, MN (US); Joseph S. Bowers, Lakeville, MN (US)

(73) Assignee: OMG Electronic Chemicals, Inc., South Plainfield, NJ (US)

( * ) Notice: Subject to any disclaimer, the term of this patent is extended or adjusted under 35 U.S.C. 154(b) by 176 days.

(21) Appl. No.: 11/416,729

(22) Filed: May 3, 2006

(65) Prior Publication Data

US 2007/0257010 A1 Nov. 8, 2007

(51) Int. Cl.
*H01B 13/00* (2006.01)
(52) U.S. Cl. .......................................... 216/21; 216/13
(58) Field of Classification Search .................... 216/13, 216/21, 105
See application file for complete search history.

(56) References Cited

U.S. PATENT DOCUMENTS

| | | | |
|---|---|---|---|
| 3,365,401 A | 1/1968 | Saubestre et al. | |
| 4,554,049 A | 11/1985 | Bastenbeck | |
| 4,647,352 A | 3/1987 | Cook | |
| 4,720,332 A | 1/1988 | Coffrey | |
| 6,323,169 B1 | 11/2001 | Abe et al. | |
| 6,332,970 B1 | 12/2001 | Coffrey | |
| 6,642,199 B2 | 11/2003 | Humphreys et al. | |
| 6,797,682 B2 | 9/2004 | Hara et al. | |
| 2002/0155048 A1 | 10/2002 | Humphreys et al. | |

FOREIGN PATENT DOCUMENTS

JP 55104481 A * 8/1980
WO WO2007-130282 11/2007

OTHER PUBLICATIONS

PCT/US07/09777 International Search Report, Nov. 9, 2007.
International Preliminary Report on Patentability corresponding to International Application Serial No. PCT/US2007/009777, mailed Nov. 13, 2008, 5 pages.

* cited by examiner

*Primary Examiner*—Roberts Culbert
(74) *Attorney, Agent, or Firm*—McAndrews, Held & Malloy, Ltd.

(57) ABSTRACT

A method of stripping nickel from a printed wiring board comprises providing a printed wiring board with a nickel deposit on a surface and contacting the nickel deposit with phosphate ions and an oxidizer. An aqueous solution comprises ammonium ions, phosphate ions and an oxidizing agent present in amounts effective to strip nickel. An aqueous solution comprises about 1% to about 10% by weight hydrogen peroxide and about 5% to about 30% by weight of an ammonium phosphate. A method of pre-treating a copper substrate comprises providing a printed wiring board having a copper substrate and contacting the copper substrate with phosphate ions, and an oxidizer. A method of neutralizing permanganate on a printed wiring board comprises providing a printed wiring board with a permanganate residue on the printed wiring board and contacting the permanganate residue with phosphate ions, and an oxidizer.

21 Claims, No Drawings us 7,591,956 B2

METHOD AND COMPOSITION FOR SELECTIVELY STRIPPING NICKEL FROM A SUBSTRATE

RELATED APPLICATIONS

[Not Applicable]

FIELD OF THE INVENTION

The present technology generally relates to stripping nickel from a substrate. For example, the present technology includes a method and composition for stripping nickel from a printed wiring board. The present technology is particularly useful for removing High Phosphorous Electroless Nickel.

BACKGROUND OF THE INVENTION

Printed wiring boards are formed from a layer of conductive material (commonly, copper or copper plated with solder or gold) carried on a layer of insulating material (commonly glass-fiber-reinforced epoxy resin). A printed wiring board having two conductive surfaces positioned on opposite sides of a single insulating layer is known as a "double-sided circuit board." To accommodate even more circuits on a single board, several copper layers are sandwiched between boards or other layers of insulating material to produce a multi-layer wiring board.

The copper or other conductive material can be plated, clad or otherwise deposited onto the insulating board and then etched into the desired formations. During manufacturing, nickel can be deposited onto the copper or other conductive substrate. This can be done, for example, using the electroless nickel part of an electroless nickel/immersion gold (ENIG) technique. The process results in a layer of electroless nickel being deposited on the conductive substrate.

Depositing an electroless nickel finish onto the conductive substrate has a number of advantages. It prevents copper oxidation, facilitates solderability and prevents defects during the assembly process.

Despite these many benefits, sometimes it would be desirable to selectively remove the deposited electroless nickel from the conductive substrate. For example, in order to re-work the copper on a faulty wiring board it would first be desirable to remove the deposited nickel. It would be important that no significant amount of copper be removed during the deposited nickel removal. Ideally the copper should remain bright, uniform and un-etched. This would allow for the best re-working surface.

Previously, the deposited electroless nickel could not be selectively removed from faulty boards. Faulty boards had to be thrown away because it was impossible to remove the nickel without also removing or damaging the copper. Reprocessing of faulty boards was impossible.

Attempts have been made using chemicals to selectively remove deposited nickel while leaving the substrate unaffected. Various degrees of success have been obtained.

U.S. Pat. No. 4,554,049 (Bastenbeck) describes a solution stated to be useful for stripping electrolytic nickel and low phosphorous electroless nickel from a ferrous metal substrate that uses sulfamate ions, nitrate ions, chloride ions and an iron complexing agent. However, this solution is not intended for the removal of electroless nickel from copper on printed wiring boards. It is more difficult to selectively remove nickel from copper than from a ferrous metal. The printed wiring board industry requires a high degree of precision when selectively removing nickel from copper. This method is not believed to achieve the required precision.

U.S. Pat. No. 4,720,332 (Coffey) discloses a nickel stripping bath that is stated to utilize soluble nitrobenzene compounds, zwitterions (as chelating agents), sulfide producing compounds, carbonates and a reverse current to remove the nickel deposit. This method is believed to microscopically etch in high current density areas, which dulls the substrate surface. This method also requires an electrical contact with the substrate. A panel that has already been selectively etched is not contactable with electric current because the etching creates gaps in the conductive material (for example copper). These gaps prevent electric current from flowing to the nickel coated surfaces and stripping the nickel. This process would also etch copper along with the nickel.

U.S. Pat. No. 6,323,169 (Abe) describes a composition said to be useful as a resist stripping agent containing an oxidizing agent, a chelating agent (selected from the group of aminopolycarboxylic acids, the salts of aminopolycarboxylic acids, phosphonic chelating agents, condensed phosphoric acids and salts of condensed phosphoric acids) and a water soluble fluorine compound. However, this is a resist stripping method and is not disclosed to selectively strip nickel from copper.

U.S. Pat. No. 6,332,970 (Coffey) describes an electrolytic method said to be useful for stripping electroless nickel from iron, cast iron, steel alloy, stainless steel, aluminum, electroplated nickel, cast nickel, iron/nickel/cobalt alloy, sulfamate nickel or titanium. Coffey discloses immersing the substrate into an electrolytic bath containing an oxoacid, oxoacid salt or a combination thereof and hydrogen peroxide. As with Bastenbeck, this method is not directed to removing electroless nickel from a copper substrate for use in printed wiring boards. Furthermore, an electrolytic method may not be suitable to remove electroless nickel from a printed wiring board. As previously stated, a panel that has already been selectively etched is not contactable with electric current because the etching creates gaps in the conductive material (for example copper). These gaps prevent electric current from flowing to the nickel coated surfaces and stripping the nickel. This process would also etch copper along with the nickel.

U.S. Pat. No. 6,642,199 (Humphreys) describes a nickel stripping composition containing an oxidizing agent, an amine and an organic or boric acid. The composition in Humphreys is said to require a pH of greater than 6.5 in order for stripping to take place. A highly alkaline formula such as the one described in the '199 patent can ruin the soldermask on a printed wiring board.

U.S. Pat. No. 6,797,682 (Hara) describes a resist stripper made up of hydrogen peroxide, a quaternary ammonium salt, water and a water soluble organic solvent. However, this is understood to be a resist stripping method and is not disclosed to selectively strip nickel from copper. Furthermore, this method is not effective on printed wiring boards because the highly alkaline formula can ruin the soldermask.

Accordingly, it would be desirable to provide a method and composition for selectively stripping nickel from a printed wiring board without removing a significant amount of the underlying substrate. It also would be desirable to provide a method of stripping nickel such that the underlying substrate is bright, uniform, not significantly etched and fit for re-working after the nickel is stripped.

SUMMARY OF THE INVENTION

The current method of stripping nickel from a printed wiring board comprises providing a printed wiring board with a nickel deposit on a surface and contacting the nickel deposit with phosphate ions and an oxidizer under conditions effective to remove at least a portion of the nickel deposit.

The current aqueous solution comprises ammonium ions, phosphate ions and an oxidizing agent present in amounts effective to strip nickel.

In one embodiment the aqueous solution comprises 1% to 10% by weight hydrogen peroxide and 5% to 30% by weight of an ammonium phosphate.

The current method of pre-treating a copper substrate comprises providing a printed wiring board having a copper substrate and contacting the copper substrate with phosphate ions, and an oxidizer under conditions effective to brighten the copper substrate.

The current method of neutralizing permanganate on a printed wiring board comprises providing a printed wiring board with a permanganate residue on the printed wiring board and contacting the permanganate residue with phosphate ions, and an oxidizer under conditions effective to neutralize the permanganate.

DETAILED DESCRIPTION

The current disclosure relates to a method and composition for selectively stripping nickel from a printed wiring board or other substrate without removing a significant amount of the underlying substrate. The current disclosure also relate to a method and composition for pre-treating a copper substrate and a method and composition for neutralizing permanganate on a printed wiring board. The embodiments disclosed herein are intended to be illustrative and should not be read as limitations to the disclosed inventions.

The method of stripping nickel from a printed wiring board (or other substrate) begins with providing a printed wiring board (or other substrate) comprising a nickel deposit on a surface. A surface on which nickel can be deposited is contemplated for use herein. A common printed wiring board surface is made of copper, although other contemplated materials include brass, tin, tin-lead, bismuth alloys and gold. The surface can have an exposed dielectric such as an epoxy panel or soldermask. Methods of depositing nickel on a surface are known to those familiar with the technology. The nickel deposit is commonly the electroless nickel deposited by the first part of an ENIG process (that is before the immersion gold layer is applied). The current technology is particularly useful in removing electroplated nickel and electroless nickel of various phosphorous levels. However, other deposits of nickel or nickel alloy can be removed using this method.

The nickel deposit is then contacted with phosphate ions and an oxidizer under conditions effective to remove at least a portion of the nickel deposit. Contemplated oxidizers include peroxides (such as hydrogen peroxide), persulfates, nitric acid, and other oxidizers capable of oxidizing nickel metal. Some contemplated sources of phosphate ions include ammonium phosphate monobasic and sodium phosphate monobasic, which can be formed by combining ammonium chloride or trisodium phosphate with phosphoric acid. Other contemplated sources of phosphate ions include ammonium phosphate dibasic, ammonium phosphate tribasic, potassium phosphate monobasic, potassium phosphate dibasic, potassium phosphate tribasic, phosphoric acid, or other soluble phosphate salts. Other combinations of chemicals providing the recited ions in solution or dispersion are also contemplated. The phosphate ions and oxidizer can be applied to the nickel deposit in a single solution.

In one embodiment ammonium ions can also be contacted with the nickel deposit. Contemplated sources of ammonium ions include without limitation ammonium phosphate monobasic, ammonium phosphate dibasic, ammonium phosphate tribasic, ammonium hydroxide, ammonium chloride, ammonium carbonate, ammonium sulfate or other soluble ammonium salts. The ammonium ions are sometimes added in conjunction with the phosphate ions as with the ammonium phosphates. The ammonium ions can be contacted to the nickel deposit in a separate solution or in a single solution with the phosphate ions and oxidizer.

Conditions that can affect nickel removal and the quality of the underlying surface include the concentrations of phosphate ions and oxidizer. In one embodiment the phosphate ions are provided in an aqueous solution at a concentration of more than about 10 g/L, alternatively over about 100 g/L or alternatively more than about 150 g/L (measured as g of $PO_4^{-3}$ per liter). Oxidizer can be provided in an aqueous solution at a concentration of about 15 to about 100 g/L, alternatively about 20 to about 30 g/L or alternatively about 25 g/L (measured as g of oxidizer molecules per liter). If persulfate is used as an oxidizer the concentration should be about 15 to about 200 g/L, alternatively about 125 to about 175 g/L or alternatively about 150 g/L (measured as g of $S_2O_8^{2-}$ molecules per liter). If ammonium ions are added, they can be provided in an aqueous solution at a concentration of about 1 to about 100 g/L, alternatively about 5 to about 50 g/L or alternatively about 25 g/L (measured as g of $NH_4^+$ molecules per liter).

Another condition that can affect nickel removal and the quality of the underlying surface is the pH of the treatment solution(s). When a single solution is employed the solution can operate at a pH of about 2 to about 12. An alternative pH range is about 2.3 to about 5.0, or about 2.5 to about 4.0. Alternatively, the pH of the solution can be about 3.2. These pH ranges are also contemplated for each treatment solution, in embodiments in which more than one treatment solution is used.

The temperature at which the nickel deposit is contacted can also affect nickel removal and the quality of the underlying surface. In one embodiment the nickel is contacted at a temperature between about 0 and about 100° C. Alternatively, contacting can occur between about 21 and about 55° C., or between about 35 and about 45° C. Alternatively, contacting can occur at about 41° C.

The time of contacting also may affect nickel removal and the quality of the underlying surface. In some embodiments, the time of contacting can offer a large operating window. A wiring board (or other substrate) contacted for 3 to 4 days can show no significant attack on the underlying surface. Thus, the contemplated contact time ranges between about 5 and about 600 minutes. Alternatively, the nickel deposit can be contacted with a treatment solution for a time sufficient to remove at least substantially all the nickel contacted by the solution, and short enough to leave the underlying substrate in condition for redeposition of nickel.

The method described herein can be carried out by placing the nickel deposit in a bath of the treatment solution. When using a bath the phosphate ions and oxidizer can be combined in an aqueous solution. The nickel deposit can then be immersed into a bath of this aqueous solution. In one embodiment, ammonium ions can also be added to the bath prior to immersion of the nickel deposit.

In certain embodiments the conditions are such that all or substantially all of the nickel deposit is removed and the underlying surface is bright, uniform and not significantly etched after the contacting step. This allows for re-working. Specifically, it allows a new layer of nickel or other metal to be deposited onto the surface. In other embodiments, as to partially etch nickel, leaving a nickel surface, less than all of the nickel deposit can be removed. It may be desirable to remove less than all of the nickel in order to speed up the nickel removal process.

In one embodiment the wiring board can be removed from contact with the treatment solution or solutions prior to removal of all or substantially all of the nickel. Without limiting the broadest scope of the invention to the following explanation, the inventors theorize that the nickel stripping process is a two stage dissolution. First the nickel reacts with the stripping solution to form nickel oxide. The nickel oxide then reacts to form $Ni^{2+}$. Since the $Ni^{2+}$ is extremely soluble it can then be rinsed off. In this embodiment, the wiring board (or other substrate) is removed from the treatment solution or solutions after most of the nickel has been removed and only a small amount of nickel oxide remains. At this point, the nickel oxide can typically be rubbed off with light pressure, such as from a finger. Persons knowledgeable in the field will know when most of the nickel has been removed such that only a small amount of nickel oxide remains. After removal, the board goes through a micro-etching process. During the micro-etching the wiring board (or other substrate) is contacted with standard etching solution. A micro-etching process known in the printed wiring board field can be used. A few examples include a peroxide/sulfuric method, a cupric chloride method, a persulfate method, a carboxylic acid method and a nitric acid method. This process speeds up the nickel removal process by removing the board from contact with the treatment solution after a shorter contacting period. It also results in a brighter underlying surface because it removes an insoluble blue crystal residue that remains after the contact with the treatment solution or solutions.

Where all or substantially all of the nickel is removed, the printed wiring board can still be put through a micro-etching process as outlined above. This will remove at least some of the insoluble blue crystal that remains after the contact with the treatment solution or solutions.

One embodiment relates to an aqueous solution. The solution is made up of phosphate ions and an oxidizing agent and can be employed at the same temperature, pH and concentration levels as previously described. Possible oxidizing agents include peroxides (such as hydrogen peroxide), persulfates, nitric acid or other oxidizers capable of oxidizing nickel metal. Contemplated sources of phosphate ions include ammonium phosphate monobasic or sodium phosphate monobasic, which can be formed by combining ammonium chloride or trisodium phosphate with phosphoric acid. Other contemplated sources of phosphate ions include ammonium phosphate dibasic, ammonium phosphate tribasic, potassium phosphate monobasic, potassium phosphate dibasic, potassium phosphate tribasic, phosphoric acid, or other soluble phosphate salts. Other combination of chemicals providing the recited ions in solution or dispersion are also contemplated.

Ammonium ions can also be added to the aqueous solution. Possible sources of ammonium ions include ammonium phosphate monobasic, ammonium phosphate dibasic, ammonium phosphate tribasic, ammonium hydroxide, ammonium chloride, ammonium carbonate, ammonium sulfate or other soluble ammonium salts. The ammonium ions are sometimes added in conjunction with the phosphate ions as with the ammonium phosphates.

The current aqueous solution can effectively strip nickel from a printed wiring board or other substrate as described above. The conditions (that is temperature, pH, concentration, etc.) described above are also applicable to the aqueous solution when used to strip nickel. The correct pH and salt phosphate ion concentration can also be obtained by mixing phosphoric acid with a base such as sodium hydroxide, ammonium hydroxide or potassium hydroxide.

The current solution is also an effective substrate pre-treatment. In the printed wiring board industry, the substrate undergoes processing prior to application of nickel in the ENIG process. This processing can include processes that make the substrate surface dull and uneven, such as pulse plating and application of the soldermask. When the underlying substrate is dull and uneven, there is a greater likelihood of problems with the nickel application during the ENIG process.

In these situations the current solution can be applied to the substrate prior to application of the nickel. This is contemplated to avoid a need to strip the nickel at a later point. When using the current solution as a substrate pre-treatment the conditions and variations described above can be used (for example temperature, pH, concentration, etc.). However, the contacting time can be from about 1 to about 60 minutes or alternatively about 1 to about 15 minutes.

The aqueous solution is also an effective permanganate neutralizer. During the printed wiring board manufacturing process, holes are drilled through the board for interconnections between inner and outer layers. The holes are then cleaned using permanganate baths in a process called desmearing. After desmearing, the permanganate residues on the board must be neutralized. Traditional neutralizers are either expensive, like hydroxyl amine sulfate, or they tend to etch too much copper and dull the surface of the copper, like sulfuric acid/peroxide mixtures.

The current solution improves the appearance of the copper while simultaneously neutralizing the permanganate residues left after desmearing the holes. When the current solution is used to neutralize permanganate, the various conditions and composition variations discussed above are applicable. However, the contacting time can be about 10 seconds to about 100 minutes or alternatively about 10 seconds to about 10 minutes. The oxidizer concentration can be about ½ to about 10% by weight of oxidizer, or alternatively about 2 to about 4% by weight of oxidizer.

One embodiment of the aqueous solution for stripping nickel is made up of about 1% to about 10% by weight of hydrogen peroxide and from about 5% to about 30% by weight of an ammonium phosphate. The aqueous solution of this embodiment can be employed at the same temperature, pH and concentration levels as previously described.

EXAMPLE 1

In one non-limiting embodiment a bath at pH 3.2 containing 250 g/L ammonium dihydrogen phosphate and 25 g/L hydrogen peroxide, is prepared. A printed wiring board including a copper circuit trace with an electroless nickel deposit applied according to the first part of an ENIG process is contacted with the bath by immersing it for 90 minutes at 41° C.

After being contacted with the bath, the nickel is found to be selectively removed from the printed wiring board. The copper remains bright and not significantly etched. The copper surface is ready for re-working.

EXAMPLE 2

In another non-limiting embodiment a bath as described in Example 1 is prepared. The copper substrate with an electroless nickel deposit applied according to the first part of an ENIG process is contacted with the bath for 3 to 4 days at 41° C.

After being contacted with the bath, the nickel is found to be selectively removed from the printed wiring board. The copper remains bright and not significantly etched. The copper surface is ready for re-working.

EXAMPLE 3

In another non-limiting embodiment a bath as described in Example 1 is prepared. The copper substrate is a copper foil with an electroless nickel deposit applied according to the first part of an ENIG process. The copper foil is contacted with the bath for 90 minutes at 41° C.

After being contacted with the bath, the nickel is found to be selectively removed from the printed wiring board. The copper remains bright and not significantly etched. The copper surface is ready for re-working.

EXAMPLE 4

In one non-limiting embodiment a bath at pH 3.9 containing 25 g/L ammonium dihydrogen phosphate, 200 g/L potassium phosphate and 4% by weight of peroxide, is prepared. A printed wiring board including a copper circuit trace with an electroless nickel deposit applied according to the first part of an ENIG process is contacted with the bath by immersing it overnight at 41° C.

After being contacted with the bath, the nickel is found to be selectively removed from the printed wiring board. The copper remains bright and not significantly etched. The copper surface is ready for re-working.

EXAMPLE 5

In one non-limiting embodiment a bath at pH 3.84 containing 50 g/L ammonium dihydrogen phosphate, 200 g/L potassium phosphate and 4% by weight of peroxide, is prepared. A printed wiring board including a copper circuit trace with an electroless nickel deposit applied according to the first part of an ENIG process is contacted with the bath by immersing it overnight at 41° C.

After being contacted with the bath, the nickel is found to be selectively removed from the printed wiring board. The copper remains bright and not significantly etched. The copper surface is ready for re-working.

EXAMPLE 6

In one non-limiting embodiment a bath at pH 3.77 containing 100 g/L ammonium dihydrogen phosphate, 100 g/L potassium phosphate and 4% by weight of peroxide, is prepared. A printed wiring board including a copper circuit trace with an electroless nickel deposit applied according to the first part of an ENIG process is contacted with the bath by immersing it overnight at 41° C.

After being contacted with the bath, the nickel is found to be selectively removed from the printed wiring board. The copper remains bright and not significantly etched. The copper surface is ready for re-working.

EXAMPLE 7

In one non-limiting embodiment a bath at pH 3.77 containing 100 g/L ammonium dihydrogen phosphate, 200 g/L potassium phosphate and 4% by weight of peroxide, is prepared. A printed wiring board including a copper circuit trace with an electroless nickel deposit applied according to the first part of an ENIG process is contacted with the bath by immersing it overnight at 41° C.

After being contacted with the bath, the nickel is found to be selectively removed from the printed wiring board. The copper remains bright and not significantly etched. The copper surface is ready for re-working.

EXAMPLE 8

In one non-limiting embodiment a bath at pH 3.25 containing 50 g/L ammonium dihydrogen phosphate, 200 g/L potassium phosphate and 4% by weight of peroxide, is prepared. A printed wiring board including a copper circuit trace with an electroless nickel deposit applied according to the first part of an ENIG process is contacted with the bath by immersing it overnight at 41° C.

After being contacted with the bath, the nickel is found to be selectively removed from the printed wiring board. The copper remains bright and not significantly etched. The copper surface is ready for re-working.

EXAMPLE 9

In one non-limiting embodiment a bath at pH 3.25 containing 100 g/L ammonium dihydrogen phosphate, 100 g/L potassium phosphate and 4% by weight of peroxide, is prepared. A printed wiring board including a copper circuit trace with an electroless nickel deposit applied according to the first part of an ENIG process is contacted with the bath by immersing it overnight at 41° C.

After being contacted with the bath, the nickel is found to be selectively removed from the printed wiring board. The copper remains bright and not significantly etched. The copper surface is ready for re-working.

EXAMPLE 10

In one non-limiting embodiment a bath at pH 3.25 containing 100 g/L ammonium dihydrogen phosphate, 200 g/L potassium phosphate and 4% by weight of peroxide, is prepared. A printed wiring board including a copper circuit trace with an electroless nickel deposit applied according to the first part of an ENIG process is contacted with the bath by immersing it overnight at 41° C.

After being contacted with the bath, the nickel is found to be selectively removed from the printed wiring board. The copper remains bright and not significantly etched. The copper surface is ready for re-working.

EXAMPLE 11

In one non-limiting embodiment a bath at pH 3.2 containing 250 g/L ammonium dihydrogen phosphate and 25 g/L hydrogen peroxide is prepared. A copper substrate is contacted with the bath by immersing it for 15 minutes at 41° C.

After being contacted with the bath, the copper is bright and not significantly etched. Electroless nickel is then deposited on the copper surface according to the first part of an ENIG process.

EXAMPLE 12

In one non-limiting embodiment a bath at pH 3.2 containing 250 g/L ammonium dihydrogen phosphate and 5% by weight of hydrogen peroxide is prepared. A printed wiring board including a circuit trace having permanganate residues from a desmearing process is contacted with the bath by immersing it for 5 minutes at 41° C.

After being contacted with the bath the permanganate is neutralized. The copper remains bright and is not significantly etched. The panel is now ready for through hole (and/or micro via) metallization.

While particular elements, embodiments and applications of the disclosed inventions have been shown and described, it will be understood, of course, that the inventions are not limited thereto since modification can be made by those skilled in the art without departing from the scope of the present disclosure, particularly in light of the foregoing teachings.

What is claimed is:

1. A method of stripping nickel from a printed wiring board, comprising:
   providing a printed wiring board comprising a nickel deposit on a copper surface; and
   contacting the nickel deposit with
   phosphate ions, and
   an oxidizer;
   wherein said contacting step occurs at a pH between about 2.3 and about 5.0 and under conditions effective to remove at least a portion of the nickel deposit from the copper surface without damaging a soldermask on the printed wiring board.

2. The method of claim 1 wherein said copper surface is bright after said contacting step.

3. The method of claim 1 wherein said copper surface is uniform after said contacting step.

4. The method of claim 1 wherein said copper surface is ready for re-working after said contacting step.

5. The method of claim 1 wherein said nickel deposit comprises electroless nickel.

6. The method of claim 1 further comprising subsequently depositing nickel on said copper surface.

7. The method of claim 1 wherein said copper surface is not significantly etched after said contacting step.

8. The method of claim 1 further comprising contacting said nickel deposit with ammonium ions.

9. The method of claim 1 wherein said phosphate ions are provided in an aqueous solution at a concentration of at least about 10 g/L.

10. The method of claim 1 wherein said oxidizer is provided in an aqueous solution at a concentration of about 15 to about 100 g/L.

11. The method of claim 1 wherein said contacting step occurs at a temperature between about 0 and about 100° C.

12. The method of claim 1 wherein the duration of said contacting step is from about 5 to about 600 minutes.

13. The method of claim 1 wherein said phosphate ions, and oxidizer are provided in the form of a single solution.

14. The method of claim 1 wherein said contacting step is carried out by forming a bath of phosphate ions and peroxide in aqueous solution and immersing said nickel deposit in said bath.

15. The method of claim 1 wherein said conditions are effective to remove substantially all of said nickel deposit from at least a portion of said copper surface.

16. The method claim of 15 further comprising contacting said copper surface with an etching solution.

17. The method of claim 1 wherein said oxidizer is selected from the group consisting of peroxides, persulfates and nitric acid.

18. A method of pre-treating a copper substrate comprising:
   providing a printed wiring board comprising a copper substrate; and
   contacting the copper substrate with
   phosphate ions, and
   an oxidizer;
   wherein said contacting step occurs at a pH between about 2.3 and about 5.0 and under conditions effective to brighten the copper substrate without damaging a soldermask on the printed wiring board.

19. The method of claim 18 further comprising contacting said copper substrate with ammonium ions.

20. A method of neutralizing permanganate on a printed wiring board comprising:
   providing a printed wiring board with a permanganate residue on the printed wiring board; and
   contacting the permanganate residue with
   phosphate ions, and
   an oxidizer;
   wherein said contacting step occurs at a pH between about 2.3 and about 5.0 and under conditions effective to neutralize the permanganate without damaging a soldermask on the printed wiring board.

21. The method of claim 20 further comprising contacting said permanganate residue with ammonium ions.

* * * * *

UNITED STATES PATENT AND TRADEMARK OFFICE
CERTIFICATE OF CORRECTION

PATENT NO. : 7,591,956 B2 Page 1 of 1
APPLICATION NO. : 11/416729
DATED : September 22, 2009
INVENTOR(S) : Bernards et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 318 days.

Signed and Sealed this

Twenty-first Day of September, 2010

David J. Kappos
*Director of the United States Patent and Trademark Office*